US009267974B2

(12) United States Patent
Flack

(10) Patent No.: US 9,267,974 B2
(45) Date of Patent: Feb. 23, 2016

(54) CONTACTOR HEALTH MONITOR CIRCUIT AND METHOD

(71) Applicant: Albert Flack, Lake Arrowhead, CA (US)

(72) Inventor: Albert Flack, Lake Arrowhead, CA (US)

(73) Assignee: AeroVironment, Inc., Simi Valley, CA (US)

( * ) Notice: Subject to any disclaimer, the term of this patent is extended or adjusted under 35 U.S.C. 154(b) by 635 days.

(21) Appl. No.: 13/655,144

(22) Filed: Oct. 18, 2012

(65) Prior Publication Data

US 2013/0038341 A1  Feb. 14, 2013

Related U.S. Application Data

(63) Continuation of application No. PCT/US2011/033134, filed on Apr. 19, 2011.

(60) Provisional application No. 61/325,791, filed on Apr. 19, 2010.

(51) Int. Cl.
| | |
|---|---|
| *G01R 27/08* | (2006.01) |
| *G01R 27/20* | (2006.01) |
| *G01R 31/04* | (2006.01) |
| *H01R 43/00* | (2006.01) |

(52) U.S. Cl.
CPC ............ *G01R 27/205* (2013.01); *G01R 31/043* (2013.01); *H01R 43/002* (2013.01)

(58) Field of Classification Search
CPC .......................... G01R 27/205; G01R 31/043
See application file for complete search history.

(56) References Cited

U.S. PATENT DOCUMENTS

| | | | |
|---|---|---|---|
| 3,626,248 A | 12/1971 | Bartlett et al. | |
| 4,491,797 A | 1/1985 | Velsher | |
| 5,365,180 A | 11/1994 | Edelman | |
| 2007/0120567 A1 | 5/2007 | Hagel et al. | |
| 2008/0116906 A1 | 5/2008 | Martin et al. | |

OTHER PUBLICATIONS

The State Intellectual Property Office of the People'S Republic of China (SIPO) Office Action (1OA) for corresponding Chinese Patent Application No. 201180030322.5 Entitled Contactor health monitor circuit and method by Albert Flack; Issued Jul. 2, 2014 from the State Intellectual Property Office of the People's Republic of China; 4 pgs.

(Continued)

*Primary Examiner* — Patrick Assouad
*Assistant Examiner* — Demetrius Pretlow
(74) *Attorney, Agent, or Firm* — Christopher R. Balzan; Eric J. Aagaard

(57) ABSTRACT

In one possible implementation, a method is provided for determining contactor health including measuring a differential voltage between a first utility line voltage and a second utility line voltage on a primary side of a contactor and on a secondary side of the contactor. The measuring is performed with both an unloaded current and with a load current. The unloaded and loaded measurements are performed at the primary side and the secondary side, and are made with the contactor closed. It includes determining a difference between a secondary unloaded voltage and a secondary loaded voltage and subtracting a difference between a primary unloaded voltage and a primary loaded voltage to provide a contactor voltage drop. The contactor resistance is determined by dividing the contactor voltage drop by the loaded current.

2 Claims, 3 Drawing Sheets

(56) References Cited

OTHER PUBLICATIONS

International Searching Authority; International Search Report (ISR) for corresponding PCT case application No. PCT/US2011/033134 entitled Contactor Health Monitor Circuit and Method by Al Flack; Apr. 19, 2011; International Searching Authority /US; 2 pgs.

International Searching Authority; Written Opinion (WO) and Search History for corresponding PCT case application No. PCT/US2011/033134 entitled Contactor Health Monitor Circuit and Method by Al Flack; Apr. 19, 2011; International Searching Authority /US; 8 pgs.

The State Intellectual Property Office of the People'S Republic of China (SIPO) Office Action (OA2) for corresponding Chinese Patent Application No. 201180030322.5 Entitled Contactor health monitor circuit and method by Albert Flack; Issued May 22, 2015 from the State Intellectual Property Office of the People's Republic of China; 4 pgs.

CONTACTOR HEALTH MONITOR CIRCUIT AND METHOD

CROSS REFERENCE TO RELATED APPLICATION

This application is a continuation of PCT/US2011/033134 by Flack, entitled CONTACTOR HEALTH MONITOR CIRCUIT AND METHOD, filed on 19 Apr. 2011, herein incorporated by reference in its entirety, which claims the benefit of the following U.S. Provisional Patent Application, which is herein incorporated by reference in its entirety:

U.S. Provisional Application 61/325,791, by Albert Flack, filed 19 Apr. 2010, entitled CONTACTOR HEALTH MONITOR CIRCUIT.

BACKGROUND

Electric vehicles may now be charged with utility power and with high current. As a result, even a small resistance in the line can be inefficient and can generate significant heat, which could pose a serious hazard. What is needed is a means to monitor the charging circuit to reduce the potential of overheating, and improve the efficiency of the circuit.

SUMMARY

In one implementation a method is provided for determining contactor health including measuring a differential voltage between a first utility line voltage and a second utility line voltage on a primary side of a contactor and on a secondary side of the contactor. The measuring is performed with both an unloaded current and with a load current. The unloaded and loaded measurements are performed at the primary side and the secondary side, and are made with the contactor closed. The method further includes determining a difference between a secondary unloaded voltage and a secondary loaded voltage and subtracting a difference between a primary unloaded voltage and a primary loaded voltage to provide a contactor voltage drop. The contactor resistance is determined by dividing the contactor voltage drop by the loaded current.

In one possible embodiment, a contactor health monitor circuit is provided which includes a first diode connected at a terminal end to a line one primary side terminal of a contactor and a second diode connected at a terminal end to a line two primary side terminal of the contactor. A third diode connected at a terminal end to a line one secondary side terminal of the contactor and a fourth diode connected at a terminal end to a line two secondary side terminal of the contactor. The circuit further includes an operational amplifier circuit. The first diode and the second diode are connected together so as to provide a summed output of the line one primary side contactor terminal and the line two primary side contactor terminal to a first input of the operational amplifier circuit. The circuit also has the third diode and the fourth diode being connected together so as to provide a summed output of the line one secondary side contactor terminal and the line two secondary side contactor terminal to a second input of the operational amplifier circuit.

In yet another embodiment, a contactor health monitor circuit is provided having a first operational amplifier connected at a first input to a line one primary side terminal of a contactor and connected at a second input to a line two primary side terminal of the contactor. The circuit also includes a second operational amplifier connected at a first input to a line one secondary side terminal of the contactor and connected at a second input to a line two secondary side terminal of the contactor. A summing amplifier is connected at a first input to an output of the first operational amplifier summed with an output of the second operation amplifier.

BRIEF DESCRIPTION OF THE DRAWINGS

The features and advantages of the present invention will be better understood with regard to the following description, appended claims, and accompanying drawings where:

DESCRIPTION

Figure 1:
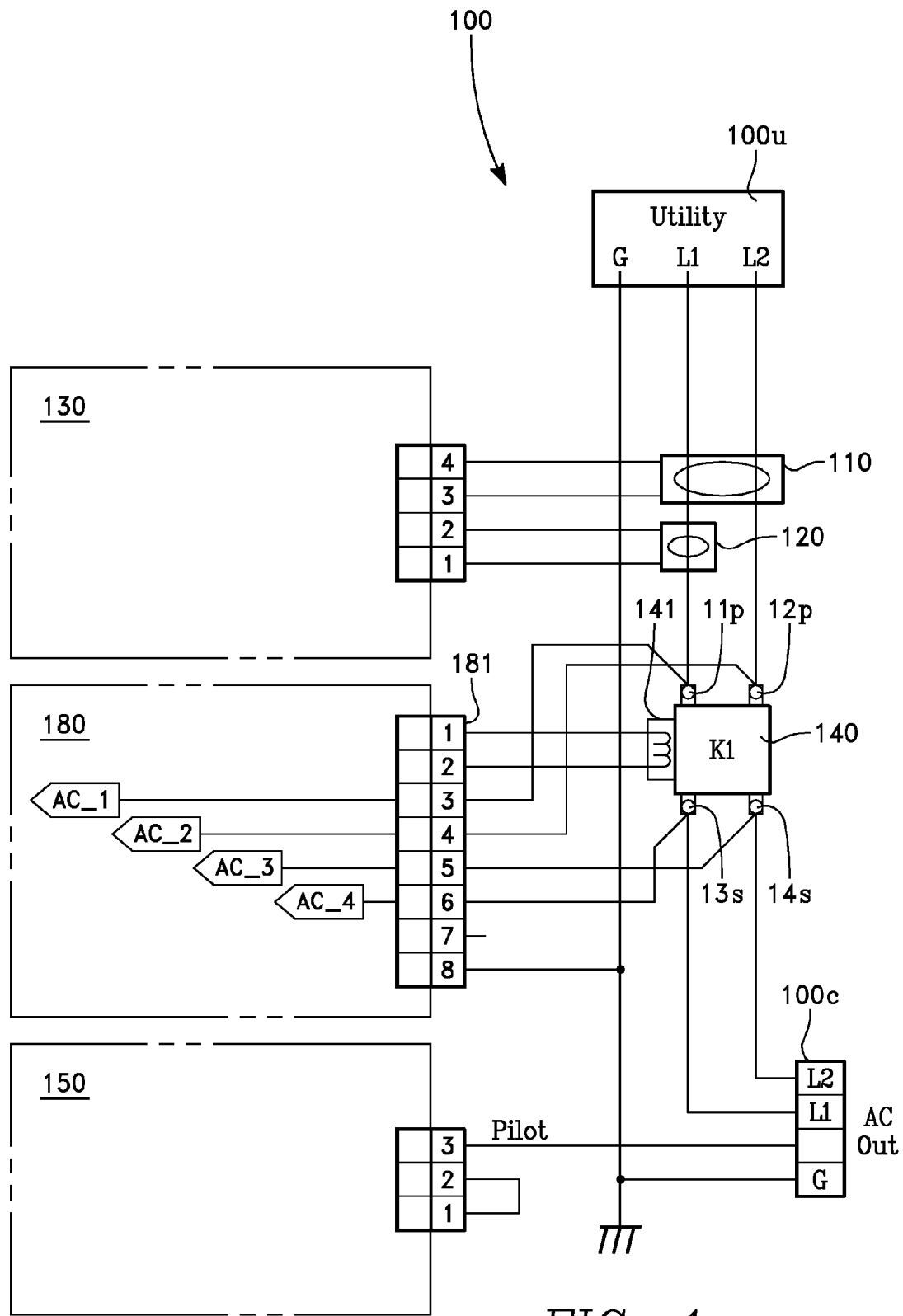
FIG. 1 shows a schematic view of a cable to connect utility power to an electric vehicle (not shown) and some associated circuitry.

FIG. 1 shows a schematic view of a cable 100 to connect utility power to an electric vehicle (not shown) along with some associated circuitry. In the embodiment of FIG. 1, the cable 100 contains L1 and L2 and ground G lines. The cable 100 connects to utility power at one end 100$u$ and to an electric vehicle (not shown) at the other end 100$c$. The electric vehicle (not show) could have an onboard charger, or, the electric vehicle end 100$c$ of the cable 100 could be connected to a separate, optionally free standing, charger (not shown). The separate charger (not shown) would in turn be connected to the electric vehicle for charging onboard batteries, or other charge storage devices. In other embodiments not shown, a charger could be integrated into the cable 100, if desired.

The contactor 140 mechanically disconnects/connects the utility power L1 and L2 from/to the vehicle connector 100$c$. Over time, the impedance of the contactor 140 increases. As such, the health of the contactor 140 must be monitored to insure that the impedance does not get too high. Thus, the terminals 11$p$, 12$p$, 13$s$, and 14$s$ of the contactor 140 are monitored by a contactor health monitor circuit 180. As used herein, the terminals 11$p$ and 12$p$ are referred to as being on the "primary side" of the contactor 140 and the terminals 13$s$ and 14$s$ are referred to as being on the "secondary side" of the contactor 140. The voltages on the terminals 11$p$, 12$p$, 13$s$, and 14$s$ are labeled as signals AC_1, AC_2, AC_3, and AC_4, respectively.

In general, a contactor health voltage monitor circuit is subject to large absolute errors at the amplifier stages due to tolerance errors in the high voltage buffer components. These errors can make absolute channel-to-channel difference comparisons useless for monitoring the very small voltage changes across the contactor. A better method is to use the two high voltage buffer stages as relative change indicators rather than absolute voltage values. This means that, for a given voltage channel, the difference in voltage readings (zero current and loaded current) from one voltage level to another level is only the given linearity error for the circuit. This is a very small error and is not affected by the precision of the resistive elements. The accuracy of the A/D converter is the governing precision determinator. For a 10 bit converter this is about 2 bits, 0.4%.

Figure 2:
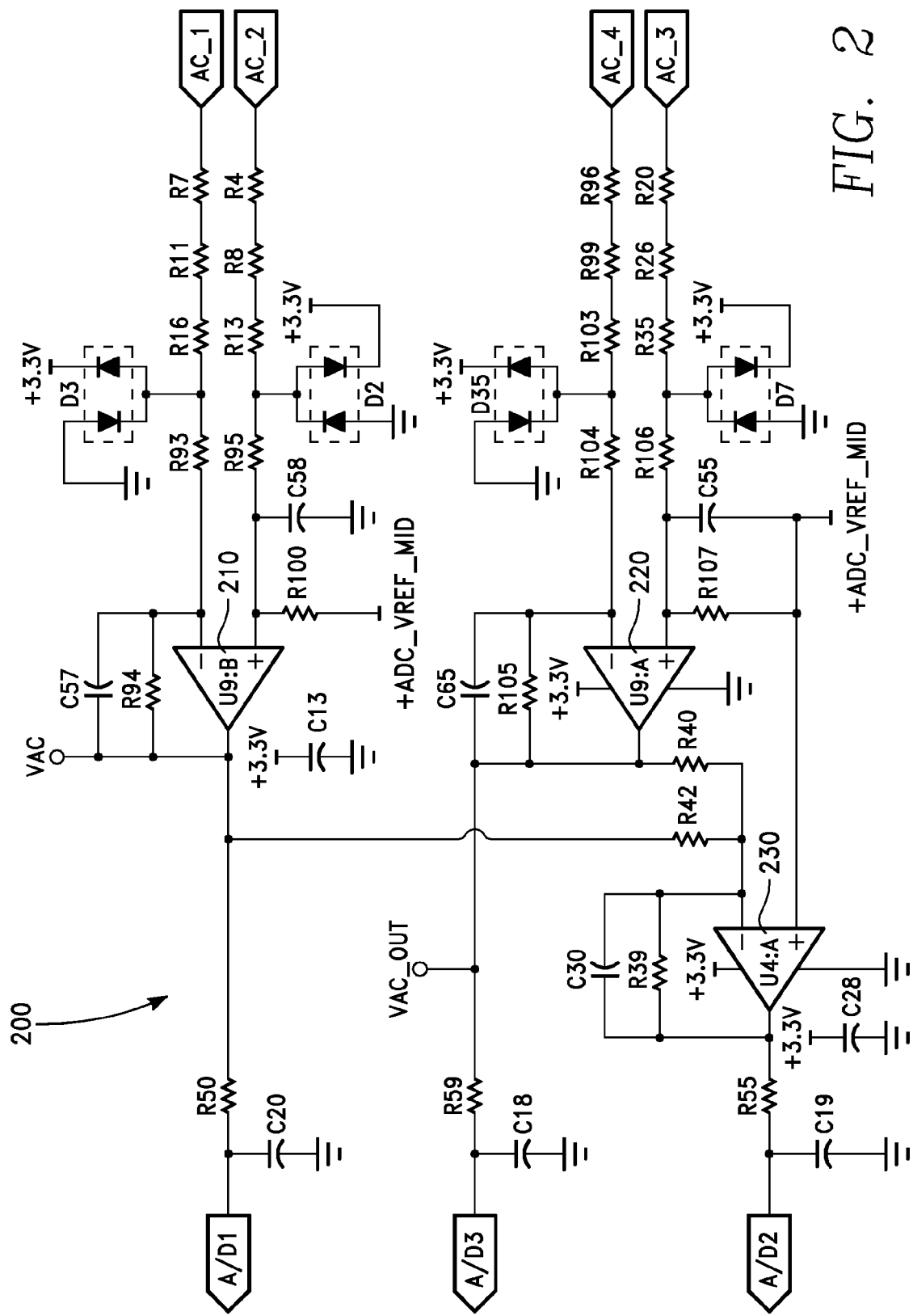
FIG. 2 shows a simplified schematic view of an embodiment of a contactor health voltage monitor circuit.

FIG. 2 shows a simplified schematic of one possible embodiment of a contactor health monitor circuit 200. The signal AC_1 is supplied via resistors R7, R11, R16, and R93, to an inverting input of the operational amplifier 210 into operational amplifier 210. The signal AC_2 is supplied via resistors R4, R8, R13, and R95, to a non-inverting input of the operational amplifier 210. A middle reference voltage signal ADC VREF MID, such as 1.5 volts, is combined via a resistor R100 with the signal AC_2 to bias the output of the operational amplifier 210 above zero so that the output does not go below zero. The output of the operational amplifier 210 is supplied via resistor R50 as signal A/D1 to an A/D converter.

The signal AC_4 is supplied via resistors R96, R99, R103, and R104 to an inverting input of the operational amplifier 220 into operational amplifier 220. The signal AC_3 is supplied via resistors R20, R26, R35, and R106, to a non-inverting input of the operational amplifier 220. A middle reference voltage signal ADC VREF MID, such as 1.5 volts, is combined via a resistor R107 with the signal AC_3 to bias the output of the operational amplifier 210 above zero so that the output does not go below zero. The output of the operational amplifier 220 is supplied via resistor R59 to an A/D converter as signal A/D3.

The output of the operational amplifier 210 and the operational amplifier 220 are summed and supplied to the inverting input of the summing amplifier 230. The summing amplifier amplifies the difference between the primary differential (L1 to L2) voltage and the secondary differential (L1 to L2) voltage. The output of the summing amplifier 230 is supplied via resistor R55 to an A/D converter as signal A/D2.

Diodes D3 and D2 provide overvoltage protection for the operational amplifier 210. Diodes D35 and D7 provide overvoltage protection for the operational amplifier 220.

In the embodiment of FIG. 2, the output signals A/D1 and A/D3 may be stored prior to summing for calculation to determine the resistance $R_c$ of the contactor 140. Alternately, the output signal A/D2 may be stored for calculation to determine the resistance $R_c$ of the contactor 140.

Figure 3:
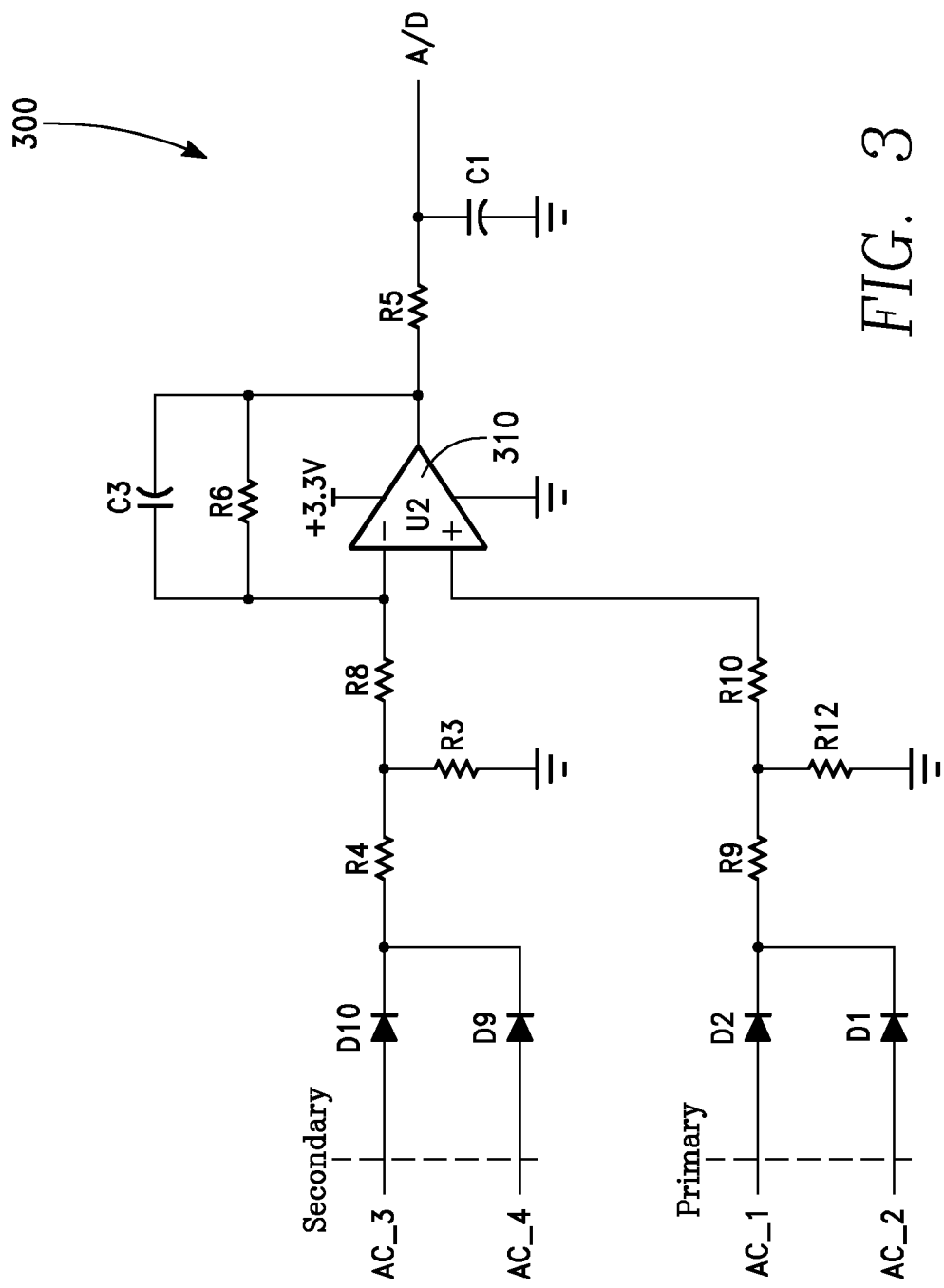
FIG. 3 shows a simplified schematic view of an alternate embodiment of a contactor health voltage monitor circuit.

FIG. 3 shows a simplified schematic of an alternative embodiment of a contactor health monitor circuit 300. In the contactor health monitor circuit 300, the AC_3 and AC_4 signals are combined after passing through diodes D10 and D9, respectively. The combined signal is supplied via resistors R4 and R8 to the inverting input of operational amplifier 310. The diodes D10 and D9 allow only the positive voltages to combine so the signals AC_3 and AC_4 do not cancel.

In the contactor health monitor circuit 300, the AC_1 and AC_2 signals are combined after passing through diodes D2 and D1, respectively. The combined signal is supplied via resistors R9 and R10 to the non-inverting input of operational amplifier 310. The diodes D2 and D1 allow only the positive voltages to combine so the signals AC_3 and AC_4 do not cancel.

In the contactor health monitor circuit 300, the output of the operational amplifier 310 is provided to an A/D converter for storage and use in determining the resistance $R_c$ of the contactor 140.

The embodiment of FIG. 3 provided improved accuracy because it has fewer resistors and because there is no common mode issues because the diodes D1, D2, D9, and D10 prevent swings of negative-to-positive voltage into/out of the operational amplifier 310. The diodes D1, D2, D9, and D10 allow the input to be entirely positive and within the operating range of the amplifier 310, which reduces the error and gives a better gain because it does not have to split the output between a positive and negative value midpoint. As such, by using diodes D1, D2, D9, and D10 to rectify, it doubles the range of accuracy.

Further, the embodiment of FIG. 3, contains fewer components, less resistors and operational amplifiers. Referring to FIG. 3, in some embodiments, R3, R4, R5, R6, R8, R9, R10, and R12 have resistance values of 55K, 3 M, 100, 600 k, 10K, 3 M, 10K, and 55K in ohms, respectively, and C1, and C3 have capacitance of 0.01 uFarad and 0.0001 microFarad, respectively.

Referring to FIG. 2, however, in some embodiments, R7, R11, and R16 have a combined resistance of 3.00 M ohms; R4, R8, and R13 have a combined resistance of 3.00 M ohms; R96, R99, and R103 have a combined resistance of 3.00 M ohms; R20, R26, and R35 have a combined resistance of 3.00 M ohms. In various embodiments, R93 is 20.0K, R94 is 10.0K, R95 is 20.0K, R100 is 10.0K, R50 is 100, R104 is 20K, R105 is 10.0K, R106 is 20K, R107 is 10.0K and R59 is 100 ohms. Further, in various embodiments, R39 is 1.00 M, R40 is 10.0K, R42 is 10.0K, R59 is 100, R39 is 1.00 M, and R55 is 100 ohms. Additionally, capacitor C13 and C28 are each 0.1 uFarad, C18 is 0.001 uFarad, C20 is 0.001 uFarad, C30 is 0.01 uFarad, C55 is 0.01 uFarad, C57 is 0.01 uFarad, C58 is 0.01 uFarad, C65 is 0.01 uFarad. Moreover, in some embodiments, most of the resistors are +/−0.1%. The embodiment of FIG. 3, however, contains fewer components, less resistors and operational amplifiers so can be more cost efficient.

Referring to FIGS. 1-3, in operation, both embodiments of the contactor health monitor circuit 200 and 300 measure the differential voltage between L1 and L2 (nominally 240 volts) on the primary side of the contactor 140 at 11p and 12p and on the secondary side of the contactor 140 at 13s and 14s. These measurements are made in both the unloaded (zero current) and the loaded (with current). Both the unloaded and loaded measurements at the primary side and the secondary side are made with the contactor 140 closed. The unloaded measurements are made before current is applied to a load (battery) within the vehicle (not shown).

The difference between the secondary unloaded and the secondary loaded voltages is subtracted from the difference between the primary unloaded and the primary loaded voltages. This number is divided by the load current to produce the resistance $R_c$ of the contactor 140. Note that the resistance $R_c$ of the contactor 140 is the total resistance for both L1 and L2 paths through the contactor 140.

Based on this approach, the method for determining contactor impedance $R_c$ may be implemented as follows. Record the contactor 140 no load AC voltages on the primary and secondary, Vp_NL and Vs_NL, respectively. Monitor the AC current and wait for a maximum current value to be obtained. Record the contactor 140 loaded AC voltages on the primary and secondary, Vp_L and Vs_L, respectively, and the loaded AC current value A_L. Use the calculation below to determine the contactor impedance, where PD=Primary Difference
SD=Secondary Difference
CD=Contactor Drop
$R_c$=Contactor Resistance $$PD = Vp\_NL - Vp\_L \text{ volts}$$

$$SD = Vs\_NL - Vs\_L \text{ volts}$$

$$CD = PD - SD \text{ volts}$$

$$R_c = CD/A\_L \text{ ohms}$$

These steps may be performed several times and the results averaged for many readings.

It is worthy to note that any reference to "one embodiment" or "an embodiment" means that a particular feature, structure, or characteristic described in connection with the embodiment may be included in an embodiment, if desired. The appearances of the phrase "in one embodiment" in various places in the specification are not necessarily all referring to the same embodiment.

The illustrations and examples provided herein are for explanatory purposes and are not intended to limit the scope of the appended claims. This disclosure is to be considered an exemplification of the principles of the invention and is not intended to limit the spirit and scope of the invention and/or claims of the embodiment illustrated.

Those skilled in the art will make modifications to the invention for particular applications of the invention.

The discussion included in this patent is intended to serve as a basic description. The reader should be aware that the specific discussion may not explicitly describe all embodiments possible and alternatives are implicit. Also, this discussion may not fully explain the generic nature of the invention and may not explicitly show how each feature or element can actually be representative or equivalent elements. Again, these are implicitly included in this disclosure. Where the invention is described in device-oriented terminology, each element of the device implicitly performs a function. It should also be understood that a variety of changes may be made without departing from the essence of the invention. Such changes are also implicitly included in the description. These changes still fall within the scope of this invention.

Further, each of the various elements of the invention and claims may also be achieved in a variety of manners. This disclosure should be understood to encompass each such variation, be it a variation of any apparatus embodiment, a method embodiment, or even merely a variation of any element of these. Particularly, it should be understood that as the disclosure relates to elements of the invention, the words for each element may be expressed by equivalent apparatus terms even if only the function or result is the same. Such equivalent, broader, or even more generic terms should be considered to be encompassed in the description of each element or action. Such terms can be substituted where desired to make explicit the implicitly broad coverage to which this invention is entitled. It should be understood that all actions may be expressed as a means for taking that action or as an element which causes that action. Similarly, each physical element disclosed should be understood to encompass a disclosure of the action which that physical element facilitates. Such changes and alternative terms are to be understood to be explicitly included in the description.

Having described this invention in connection with a number of embodiments, modification will now certainly suggest itself to those skilled in the art. The example embodiments herein are not intended to be limiting, various configurations and combinations of features are possible. As such, the invention is not limited to the disclosed embodiments, except as required by the appended claims.

What is claimed is:

1. A method for determining contactor health, the method comprising:
    a) measuring a differential voltage between a first utility line voltage and a second utility line voltage on a primary side of a contactor and on a secondary side of the contactor;
    b) wherein the measuring is performed with both an unloaded current and with a load current;
    c) wherein both the unloaded and loaded measurements at the primary side and the secondary side are made with the contactor closed;
    d) determining a difference between a secondary unloaded voltage and a secondary loaded voltage and subtracting a difference between a primary unloaded voltage and a primary loaded voltage to provide a contactor voltage drop; and
    e) determining the contactor resistance by dividing the contactor voltage drop by the loaded current.

2. The method of claim 1, further comprising repeating the measuring, the determining the difference, and the determining the contactor resistance, and further comprising using a plurality of samples of the contactor resistance to determine an averaged contactor resistance.

* * * * *